United States Patent
Kawamoto

(10) Patent No.: US 9,800,142 B2
(45) Date of Patent: Oct. 24, 2017

(54) SWITCHING ELEMENT DRIVING CIRCUIT

(71) Applicant: DENSO CORPORATION, Kariya, Aichi-pref. (JP)

(72) Inventor: Ippei Kawamoto, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 15/219,339

(22) Filed: Jul. 26, 2016

(65) Prior Publication Data

US 2017/0033684 A1    Feb. 2, 2017

(30) Foreign Application Priority Data

Jul. 28, 2015    (JP) .................................. 2015-148804

(51) Int. Cl.
| | |
|---|---|
| *G05F 1/10* | (2006.01) |
| *H02M 3/07* | (2006.01) |
| *H03K 5/08* | (2006.01) |
| *H03K 17/16* | (2006.01) |

(52) U.S. Cl.
CPC ............. *H02M 3/07* (2013.01); *H02M 3/073* (2013.01); *H03K 5/08* (2013.01); *H03K 17/165* (2013.01); *H02M 2003/075* (2013.01)

(58) Field of Classification Search
CPC ....... H01L 2924/00; H01L 2924/00014; H01L 2924/48091; H01L 2924/48465
See application file for complete search history.

(56) References Cited

U.S. PATENT DOCUMENTS

| | | | | |
|---|---|---|---|---|
| 5,650,741 A | * | 7/1997 | Nakamura | ............ H02M 3/073 327/313 |
| 6,049,201 A | * | 4/2000 | Feldtkeller | .............. H02M 3/07 323/284 |
| 2008/0013760 A1 | | 1/2008 | Mitsuda | |
| 2011/0169475 A1 | * | 7/2011 | Koyasu | ................... G05F 3/267 323/311 |
| 2013/0168563 A1 | * | 7/2013 | Kim | ......................... G01T 1/16 250/370.06 |
| 2013/0193852 A1 | * | 8/2013 | Frattini | ................ H05B 37/036 315/122 |

FOREIGN PATENT DOCUMENTS

| | | |
|---|---|---|
| JP | 2007-214647 A | 8/2007 |
| JP | 2013-255339 A | 12/2013 |

* cited by examiner

*Primary Examiner* — Sibin Chen
(74) *Attorney, Agent, or Firm* — Posz Law Group, PLC

(57) ABSTRACT

A switching element driving circuit includes a charge pump circuit and a drive voltage generating circuit. The charge pump circuit generates a boosted voltage. The drive voltage generating circuit generates a drive voltage for driving a switching element from the boosted voltage. The drive voltage generating circuit applies a current to a control terminal of the switching element through a resistor at least in an initial stage and an end stage of an output period during which a signal instructing the switching element to be turned on is outputted, and alleviates a rising and a falling of the drive voltage. A switching frequency of the charge pump circuit is set from 2 MHz to 30 MHz. As a result, generation of radio noise can be restricted in both of the drive voltage generating circuit and the charge pump circuit.

9 Claims, 3 Drawing Sheets

SWITCHING ELEMENT DRIVING CIRCUIT

CROSS REFERENCE TO RELATED APPLICATION

This application is based on Japanese Patent Application No. 2015-148804 filed on Jul. 28, 2015, the disclosure of which is incorporated herein by reference.

TECHNICAL FIELD

The present disclosure relates to a switching element driving circuit that generates a drive voltage for driving a voltage-driven switching element having an input capacitance at a control terminal.

BACKGROUND

For example, JP 2011-166727 A (corresponding to US 2011/0169475 A1) discloses a signal output circuit that can reduce generation of radio noise when a switching element such as MOSFET is pulse-width-modulation (PWM) driven.

In the signal output circuit disclosed in JP 2011-166727 A, a capacitor is connected between a gate and a source of the MOSFET, and a gate terminal is provided with relatively large gate capacitance. A charging current for charging the gate capacitance when the MOSFET is changed from an off-state to an on-state, and a discharging current for discharging the gate capacitance when the MOSFET is changed from the on-state to off-state are generated in a current mirror circuit. Variation of the gate voltage of the switching element is alleviated using a time constant between an internal resistance of the current mirror circuit and the gate capacitance. As a result, when the MOSFET is turned on and turned off, a gradient of a waveform of current applied to a load by the MOSFET can be alleviated, and radio noise can be reduced.

SUMMARY

The signal processing circuit disclosed in JP 2011-166727 A has MOSFET with relatively large gate capacitance. In order to drive the MOSFET certainly, the gate voltage of the MOSFET is generated from a boosted voltage generated in a voltage booster circuit including a charge pump circuit.

In general, the charge pump circuit includes an external capacitance, and a driving frequency (i.e., switching frequency) is set as low as possible (e.g., 50 kHz) in points of view of noise or cost. However, when the charge pump circuit is driven at a low driving frequency, there is a possibility that a high order noise caused by the driving provides a radio noise in the AM frequency band. As a result, although the variation of the gate terminal voltage of the switching element is alleviated, there is a possibility that noise cannot be reduced sufficiently.

It is an object of the present disclosure to provide the switching element driving circuit that can sufficiently restrict noise even when a drive voltage of the switching element is generated with a charge pump circuit.

According to an aspect of the present disclosure, a switching element driving circuit includes a charge pump circuit and at least one drive voltage generating circuit. The charge pump circuit generates a boosted voltage. The drive voltage generating circuit generates a drive voltage, for driving at least one voltage-driven switching element having an input capacitance at a control terminal, from the boosted voltage generated in the charge pump circuit. The drive voltage generating circuit applies a current to the control terminal of the voltage-driven switching element through a resistor at least in an initial stage and an end stage of an output period during which a signal instructing the voltage-driven switching element to be turned on is outputted. The drive voltage generating circuit alleviates a rising and a falling of the drive voltage using the input capacitance.

The charge pump circuit includes a plurality of capacitors and a control circuit. The control circuit switches a voltage, which is applied to one electrode of each of the plurality of capacitors, between a high-potential-voltage and a low-potential-voltage at a predetermined switching frequency to alternately perform a charging and a discharging of each of the plurality of capacitors. The control circuit integrates charges of the plurality of capacitors in an order from a first capacitor to a last capacitor, the first capacitor being one capacitor of the plurality of capacitors, the last capacitor being another capacitor of the plurality of capacitors, and each voltage outputted from the plurality of capacitors being sequentially boosted in the order from the first capacitor to the last capacitor.

The switching frequency of the charge pump circuit is set from 2 MHz to 30 MHz.

The switching element driving circuit according to the aspect of the present disclosure applies the current to the control terminal of the switching element through the resistor at least in the initial stage and the end stage of the output period during which the signal instructing the switching element, which has the input capacitance at the control terminal, to be turned on is outputted. As such, the rising and the falling of the drive voltage can be alleviated using the input capacitance of the control terminal, and generation of radio noise caused by the driving of the switching element can be restricted.

Furthermore, in the switching element driving circuit according to the aspect of the present disclosure, the switching frequency of the charge pump circuit is set from 2 MHz to 30 MHz. Since the switching frequency of the charge pump circuit is set higher than an AM frequency band (i.e., equal to or higher than 2 MHz), generation of radio noise caused by the driving of the switching element can be restricted.

When the switching frequency of the charge pump circuit 20 is increased, there is a possibility that charging/discharging of the capacitor cannot catch up with switching speed and efficiency is decreased. Therefore, the maximum of the switching frequency is preferably around 30 MHz.

BRIEF DESCRIPTION OF THE DRAWINGS

The above and other objects, features and advantages of the present disclosure will become more apparent from the following detailed description made with reference to the accompanying drawings, in which like parts are designated by like reference numbers and in which.

DETAILED DESCRIPTION

Figure 1:
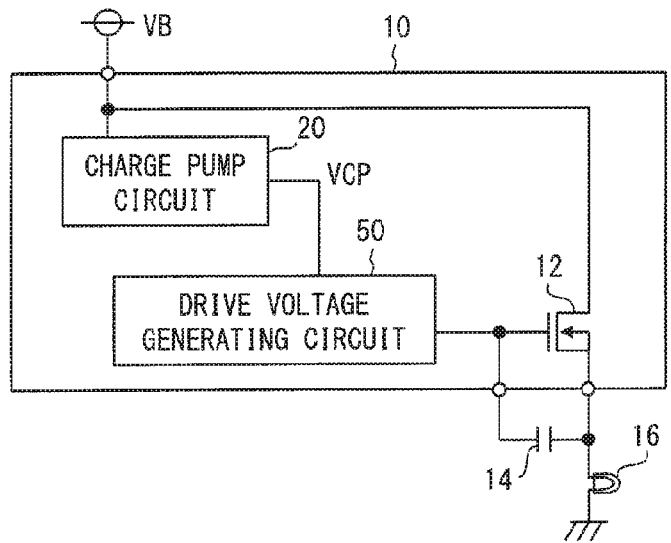
FIG. 1 is a structure diagram conceptionally illustrating an entire structure of a switching element driving circuit of an embodiment.

An embodiment of the present disclosure will be hereinafter described with reference to the drawings. FIG. 1 is a structure diagram conceptionally illustrating an entire structure of a switching element driving circuit of the present embodiment. The switching element driving circuit of the present embodiment is employed, for example, to PWM control the amount of a current applied to a lamp or a LED included in a room light, a back lamp or a flasher of a vehicle to control brightness. However, an electric load driven by the switching element driving circuit is not limited to the lamp or the LED, any electric load that PWM controls a load current may be driven by the switching element driving circuit of the present embodiment.

As shown in FIG. 1, the switching element driving circuit includes an N channel MOSFET 12, a charge pump circuit 20 and a drive voltage generating circuit 50. The N channel MOSFET 12 is one example of a voltage-driven switching element. The charge pump circuit 20 boosts a battery voltage VB supplied from a battery source of the vehicle. The drive voltage generating circuit 50 generates a drive voltage for turning on and tuning off the N channel MOSFET 12 from a boosted voltage VCP boosted in the charge pump circuit 20.

Between the battery source and a ground, a lamp 16, which is one example of an electric load is, connected in series with the N channel MOSFET 12 and connected between a source of the N channel MOSFET 12 and the ground. A conduction state of the N channel MOSFET 12 is PWM controlled by applying a gate voltage (i.e., a drive voltage) to a gate terminal (i.e., a control terminal) of the N channel MOSFET 12 and suspending the gate voltage, based on a PWM signal provided from an external control device. As a result, the amount of the current applied to the lamp 16 can be controlled to be a desired amount.

A capacitor 14 is connected between a gate of the N channel MOSFET 12 and the source of the N channel MOSFET 12. The capacitor 14 has a capacitance larger than a gate-to-source capacitance of the N channel MOSFET 12. Although the details will be described later, the capacitor 14 is employed to at least alleviate a rising and a falling of the gate voltage for turning on the N channel MOSFET 12 to moderate a variation of the gate voltage. When the N channel MOSFET 12 has a relatively large gate-to-source capacitance, the capacitor 14 may be omitted. A parasitic gate-to-source capacitance of the N channel MOSFET 12 may be employed as the capacitor 14.

In the present embodiment, the N channel MOSFET 12, the charge pump circuit 20 and the drive voltage generating circuit 50 are formed on a common semiconductor substrate 10. For example, however, since the N channel MOSFET 12 generates a large heat, the N channel MOSFET 12 may be formed on another dedicated semiconductor substrate to enhance a heat dissipation. IGBT may be employed as the voltage-driven switching element instead of the MOSFET.

Figure 2:
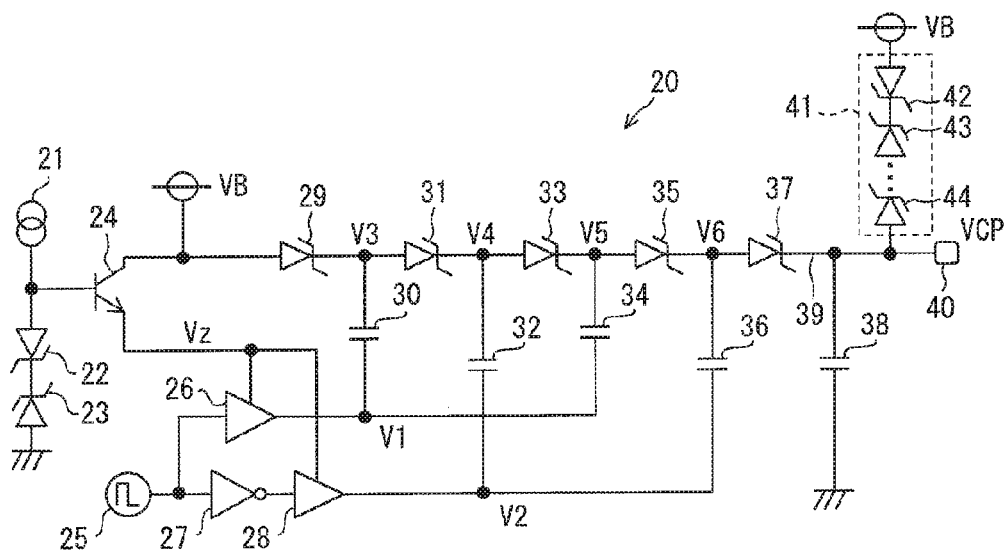
FIG. 2 is a circuit diagram illustrating one example of a circuit structure of a charge pump circuit.

Next, the charge pump circuit 20 will be described in details. FIG. 2 is a circuit diagram illustrating one example of a circuit structure of a charge pump circuit.

As shown in FIG. 2, the charge pump circuit 20 has a constant current source 21. The constant current source 21 applies a constant current to a pair of Zener diodes 22 and 23 connected opposite to each other. A connection line connecting the constant current source 21 and the Zener diodes 22 and 23 is connected to a base of a NPN transistor 24 that has a collector connected to the battery source. Therefore, a base potential of the NPN transistor 24 is equal to the sum of a Zener voltage $V_Z$ of the Zener diode 23 and a forward voltage $V_F$ of the Zener diode 22. The NPN transistor 24 is turned on by the base potential.

When the NPN transistor 24 is turned on, a voltage (hereinafter, referred to as an emitter voltage) outputted from an emitter of the NPN transistor 24 is equal to the difference subtracting a base-to-emitter voltage $V_{BE}$ of the NPN transistor 24 from the base potential. Since the forward voltage $V_F$ of the Zener diode 22 and the base-to-emitter voltage $V_{BE}$ of the NPN transistor 24 are approximately equal to each other, the emitter voltage of the NPN transistor 24 is approximately equal to the Zener voltage $V_Z$ of the Zener diode 23.

The emitter voltage of the NPN transistor 24 is provided for buffers 26 and 28. Each of the buffers 26 and 28 outputs a voltage having zero potential (hereinafter, referred to as a zero voltage) from an output terminal when a voltage having a low level is inputted to an input terminal. Each of the buffers 26 and 28, outputs the emitter voltage of the NPN transistor 24, that is, a voltage corresponding to the Zener voltage $V_Z$ of the Zener diode 23 from the output terminal when a voltage having a high level is inputted to the input terminal.

The charge pump circuit 20 has an oscillator 25 that alternately outputs the voltage having the low level and the voltage having the high level at a predetermined switching frequency. In the present embodiment, an arbitrary switching frequency within a range from 2 MHz to 30 MHz is employed as the predetermined switching frequency. When the switching frequency within such a range is employed, the switching frequency is higher than at least an AM frequency band. Therefore, generation of a radio noise caused by the driving of the charge pump circuit 20 can be restricted. However, when the switching frequency of the charge pump circuit 20 is extremely increased, there is a possibility that charging/discharging of the capacitor cannot catch up with switching speed and efficiency is decreased. Therefore, the maximum of the switching frequency is preferably around 30 MHz. When reduction of the radio noise and the efficiency of the charge pump are considered, a range from 5 MHz to 20 MHz is further preferable for the range of the switching frequency.

Figure 3:
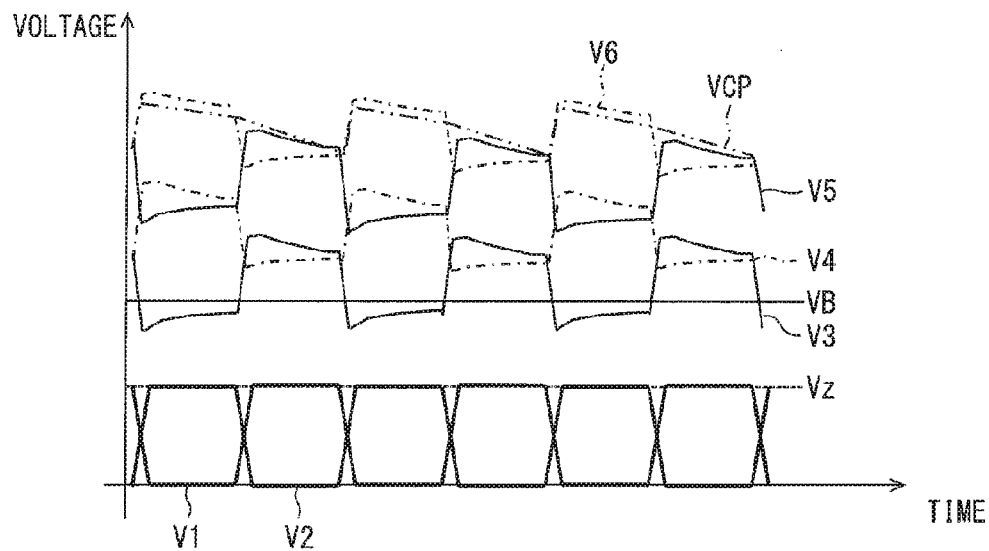
FIG. 3 is a waveform diagram for explaining an operation of the charge pump circuit.

An output of the oscillator 25 is directly inputted into the input terminal of the buffer 26. On the other hand, the output of the oscillator 25 is inputted into the input terminal of the buffer 28 through an inverter 27. Therefore, voltage levels inputted into the input terminal of the buffer 26 and the buffer 28 vary at phases opposite to each other. A voltage outputted from the output terminal of the buffer 26 is referred to as an output voltage V1, and a voltage outputted from the output terminal of the buffer 28 is referred to as an output voltage V2. As shown in FIG. 3, the output voltage V1 and the output voltage V2 vary at the phases opposite to each other. That is, when one of the output voltage V1 and the output voltage V2 is equal to the zero voltage, another one of the output voltage V1 and the output voltage V2 is equal to the Zener voltage $V_Z$. Conversely, when one of the output voltage V1 and the output voltage V2 is equal to the Zener voltage $V_Z$, another one of the output voltage V1 and the output voltage V2 is equal to the zero voltage.

The charge pump circuit 20 includes capacitors 30, 32, 34, 36 and 38. Each of the capacitors 30, 32, 34, 36 and 38 includes a pair of electrodes and an insulation film. The electrodes are made of conductors. The insulation film is formed at a surface of the semiconductor substrate 10 and arranged between the pair of electrodes. For example, a first electrode of the pair of electrodes is made of a region having a high impurity concentration that is formed at a surface layer of the semiconductor substrate 10, and a second electrode of the pair of electrodes is made of a conductor including aluminum or a poly silicon. For example, the insulation film is arranged on the first electrode, and the second electrode is arranged on the insulation film. Each of the capacitors 30, 32, 34, 36 and 38 has the same capacitance within, for example, a range from 40 to 60 pF.

As described above, since the charge pump circuit 20 has the switching frequency equal to or more than 2 MHz, the charge pump circuit 20 can generate the boosted voltage capable of driving the N channel MOSFET 12 with the capacitors 30, 32, 34, 36 and 38 having small capacitance from 40 to 60 pF. Also as described above, the capacitors having small capacitance can be formed by using the semiconductor substrate 10. Therefore, costs of the capacitors 30, 32, 34, 36 and 38 can be reduced.

One end of each of the capacitors 30, 32, 34, 36 and 38 is connected to a connection line 39 that is connected to an output terminal 40 of the charge pump circuit 20. Backflow preventing diodes 29, 31, 33, 35 and 37 each of which prevents a current reversing from each of the capacitors 30, 32, 34, 36 and 38 are disposed on the connection line 39. That is, the first backflow preventing diode 29 is disposed between the first capacitor 30 and the battery source in order to prevent the current reversing from the first capacitor 30. The second backflow preventing diode 31 is disposed between the second capacitor 32 and the first capacitor 30 in order to prevent the current reversing from the second capacitor 32. Similarly, the third backflow preventing diode 33 is disposed between the third capacitor 34 and the second capacitor 32, the fourth backflow preventing diode 35 is disposed between the fourth capacitor 36 and the third capacitor 34, and the last backflow preventing diode 37 is disposed between the last capacitor 38 and the fourth capacitor 36.

The backflow preventing diodes 29, 31, 33, 35 and 37 are Zener diodes. The backflow preventing diodes 29, 31, 33, 35 and 37 are formed at the semiconductor substrate 10 by the production method (e.g., ion implanting process, thermal diffusion process) similar to the pair of Zener diodes 22 and 23 so as to have the similar characteristic, that is, similar Zener voltage $V_Z$ to the pair of Zener diodes 22 and 23.

The other electrode of each of the capacitors 30, 32, 34 and 36, other than the capacitor 38, is connected to one of the output terminal of the buffer 26 and the output terminal of the buffer 28. More specifically, the other electrode of the first capacitor 30 and the other electrode of the third capacitor 34 are connected to the output terminal of the buffer 26. The other electrode of the second capacitor 32 and the other electrode of the fourth capacitor 36 are connected to the output terminal of the buffer 28.

The charge pump circuit 20 has a clamp circuit 41 that clamps the boosted voltage VCP outputted from the output terminal 40 at a predetermined target voltage. For example, the clamp circuit 41 is provided by a series circuit of a Zener diode 42 that is connected opposite to a direction from the connection line 39 to the battery source, and the predetermined number of Zener diodes 43 and 44 that are connected forward to the direction from the connection line 39 to the battery source. The Zener diodes 42 to 44 providing the clamp circuit 41 are formed at the semiconductor substrate 10 by the production method (e.g., ion implanting process, thermal diffusion process) similar to the pair of Zener diodes 22 and 23 so as to have the similar characteristic, that is, similar Zener voltage $V_Z$ to the pair of Zener diodes 22 and 23.

An operation of the charge pump circuit 20 will be described with reference to the waveform diagram of FIG. 3.

For example, when the output voltage V1 of the buffer 26 is equal to the zero voltage and the output voltage V2 of the buffer 28 is equal to the Zener voltage $V_Z$, the potential of the other electrode of the first capacitor 30 is equal to zero. As a result, the first capacitor 30 receives the current from the battery source through the backflow preventing diode 29, and the first capacitor 30 is charged. When the first capacitor 30 is charged, as shown in FIG. 3, the potential V3 of the one electrode of the capacitor 30 is equal to the potential $(V_B-V_F)$ that is lower than the battery voltage VB approximately by the forward voltage $V_F$ of the backflow preventing diode 29. When the output voltage V1 of the buffer 26 is changed to the Zener voltage $V_Z$ and the output voltage V2 of the buffer 28 is changed to the zero voltage, the Zener voltage $V_Z$ outputted from the buffer 26 is applied to the other electrode of the first capacitor 30, and the potential V3 of the one electrode of the first capacitor 30 is increased by the Zener voltage $V_Z$. Accordingly, the maximum value of the potential V3 of the one electrode of the first capacitor 30 is $(VB-V_F)+V_Z$.

In this case, the potential of the other electrode of the second capacitor 32 is equal to zero. As a result, a potential V4 of the one electrode of the second capacitor 32 is lower than the potential V3 of the one electrode of the first capacitor 30, and the second capacitor 32 is charged by the current discharged from the first capacitor 30.

When there is no limit set to the boosted voltage VCP outputted from the charge pump circuit 20, the potential V4 of the one electrode of the second capacitor 32 is approximately equal to $(VB+V_Z-2V_F)$. In this case, however, when levels of the output voltage V1 and the output voltage V2 are inverted, the potential V3 of the one electrode of the first capacitor 30 is equal to $(VB-V_F)$ and the potential V4 of the one electrode of the second capacitor 32 is equal to the $((VB+V_Z-2V_F+V_Z)$. That is, the potential difference between the potential V3 and the potential V4 exceeds the Zener voltage $V_Z$, that is, a withstand voltage of the second backflow preventing diode 31.

Therefore, in the present embodiment, the clamp circuit 41 is disposed to clamp the boosted voltage VCP outputted from the charge pump circuit 20 to the target voltage that is determined based on the battery voltage VB.

The target voltage of the clamp circuit 41 is set such that a difference of amplitudes of voltage variations between the adjacent two of the capacitors 30, 32, 34 and 36 does not exceed the withstand voltage (i.e., Zener voltage $V_Z$) of corresponding one of the backflow preventing diodes 31, 33 and 35 when the charging and the discharging of the capacitors 30, 32, 34 and 36 are alternately performed so as to integrate the charges of the capacitors 30, 32, 34, 36, 38. For example, the target voltage of the clamp circuit 41 is set such that the difference between the amplitude of the voltage variation of the first capacitor 30 and the amplitude of the voltage variation of the second capacitor 32 does not exceed the withstand voltage of the second backflow preventing diode 31.

In other words, since the charge pump circuit 20 shown in FIG. 2 has four capacitors 30, 32, 34 and 36 that alternately repeat charging/discharging, theoretically, the charge pump circuit 20 can output the boosted voltage equal to $(VB-V_F)+3(V_Z-V_F)$. However, since the clamp circuit 41 clamps the voltage outputted from the charge pump circuit 20 at the predetermined target voltage, increasing of the potential in each of the capacitors 30, 32, 34 and 36 can be suppressed to be equal to or lower than the theoretical value. More specifically, the voltage difference between the battery voltage VB and the target voltage of the clamp circuit 41 are almost equally divided into the boosting between the first capacitor 30 and the second capacitor 32, the boosting between the second capacitor 32 and the third capacitor 34 and the boosting between the third capacitor 34 and the fourth capacitor 36. When the target voltage of the clamp circuit 41 is suitably set, the differences of the amplitudes of voltage variations between the adjacent two of the capacitors 30, 32, 34 and 36, that is, V4−V3, V5−V4 and V6−V5 do not exceed the withstand voltages of the second backflow preventing diode 31, the third backflow preventing diode 33 and the fourth backflow preventing diode 35.

In such a case, it is preferable to set the target voltage of the clamp circuit 41 such that the differences of the amplitudes of voltage variations between the adjacent two of the capacitors 30, 32, 34 and 36 are approached to the withstand voltages of corresponding backflow preventing diodes 31, 33 and 35. As a result, recovery currents of the backflow preventing diodes 31, 33 and 35 can be restricted and the efficiency of the charge pump circuit 20 can be further increased.

As shown in FIG. 3, the last capacitor 38 is charged by the voltage boosted by the charging/discharging operations of the capacitors 30, 32, 34 and 36. The last capacitor 38 provides the drive voltage generating circuit 50 with the charged voltage of the last capacitor 38 as the boosted voltage VCP of the charge pump circuit 20 through the output terminal 40.

Figure 4:
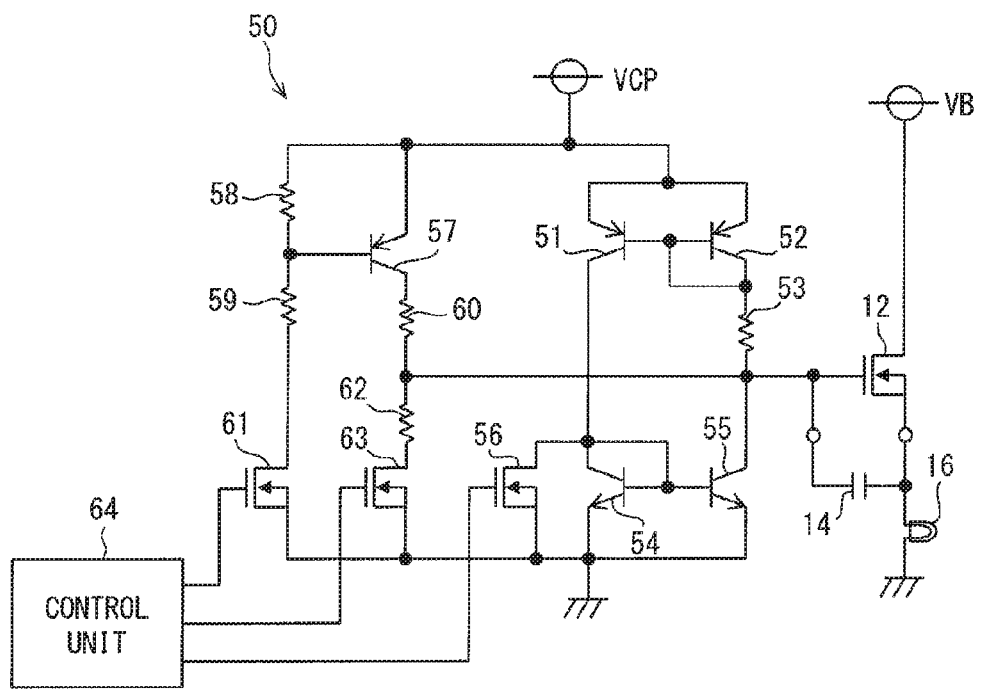
FIG. 4 is a circuit diagram illustrating one example of a circuit structure of a drive voltage generating circuit.

Next, the drive voltage generating circuit 50 will be described in details. FIG. 4 is a circuit diagram illustrating an example of the circuit structure of the drive voltage generating circuit 50.

As shown in FIG. 4, the drive voltage generating circuit 50 has a first current mirror circuit provided by a pair of PNP transistors 51 and 52. The emitters of the PNP transistors 51 and 52 are connected to the input terminal of the boosted voltage VCP outputted from the charge pump circuit 20 described above. Therefore, the boosted voltage VCP is applied to the emitters of the PNP transistors 51 and 52. Both of the bases of the PNP transistors 51 and 52 are connected to the collector of the PNP transistor 52. The collector of the PNP transistor 51 is connected to a collector of an NPN transistor 52 providing a second current mirror circuit, which is described later. The collector of the PNP transistor 52 is connected to the gate of the N channel MOSFET 12 through the resistor 53.

The NPN transistor 54 provides the second current mirror circuit with another NPN transistor 55. Both of the bases of the NPN transistors 54 and 55 providing the second current mirror circuit are connected to the collector of the NPN transistor 54. Both of the emitters of the NPN transistors 54 and 55 are connected to the ground. The collector of the NPN transistor 55 is connected to the gate of the N channel MOSFET 12.

An N channel MOSFET 56 is connected in parallel with the NPN transistor 54. The gate of the N channel MOSFET 56 receives the PWM signal from the control unit 64.

When a mirror ratio between the PNP transistors 51 and 52 of the first current mirror circuit is set to 1:N, a mirror ratio between the NPN transistors 54 and 55 of the second current mirror circuit is set to 1:2N.

Between the input terminal of the boosted voltage VCP and the ground, a series circuit including a resistor 58, a resistor 59 and an N channel MOSFET 61, and a series circuit including a PNP transistor 57, a resistor 60, a resistor 62 and an N channel MOSFET 63 are connected. The base of the PNP transistor 57 is connected to a common connection line between the resistor 58 and the resistor 59. A common connection line between the resistor 60 and the resistor 62 is connected to the gate of the N channel MOSFET 12.

Next, an operation of the drive voltage generating circuit 50 will be described. The control unit 64 outputs the PWM signal instructed by an upper control unit, which is not illustrated, to the gate terminal of the N channel MOSFET 56.

Figure 5:
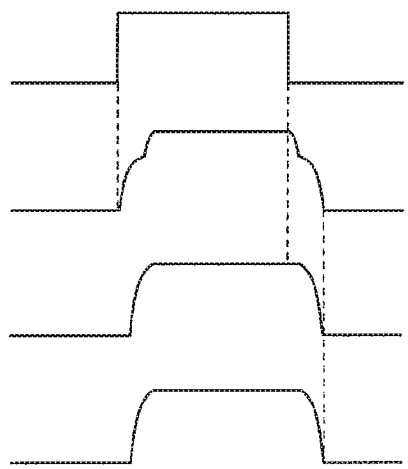
FIG. 5 is a waveform diagram for explaining an operation of the drive voltage generating circuit.

When a level of the PWM signal is changed from low-level to high-level as shown in (a) of FIG. 5, the N channel MOSFET 56 is changed from the off-state to the on-state. When the N channel MOSFET 56 is changed to the on-state, a collector voltage of the NPN transistor 54, which is one of the NPN transistors providing the second current mirror circuit, decreases to be a ground level. As a result, both of the NPN transistors 54 and 55 providing the second current mirror circuit are turned off.

Since the collector current is applied to the PNP transistor 51 through the N channel MOSFET 56 in the on-state, the current is also applied to the PNP transistor 52 of the pair. That is, the first current mirror circuit operates. In this case, the current applied to the PNP transistor 52 flows into the gate of the N channel MOSFET 12 through the resistor 53. The N channel MOSFET 12 has a capacitance between the gate and the source, and the capacitor 14 is connected in parallel with the capacitance of the N channel MOSFET 12. Therefore, the current flowing into the gate charges these input capacitances and raises the gate potential. When the gate potential is raised to be equal to the predetermined potential, the N channel MOSFET 12 is turned on to supply the lump 16 with the current.

During the above operation, the input capacitance C between the gate and the source of the N channel MOSFET 12 including the capacitor 14 is charged by the current flowing through the resistor 53 having the resistance value R with the predetermined time constant. As a result, as shown in (b) of FIG. 5, the rising of the waveform of the gate voltage is alleviated. The variation of the gate voltage Vg is expressed by the following formula 1. t represents time.

$$Vg = Vcp[1 - \exp\{-t(CR)\}] \quad \text{(Formula 1)}$$

Since the N channel MOSFET 12 is a source follower circuit, as shown in (c) of FIG. 5, the potential of the source of the N channel MOSFET 12, which is a common connection point with the lump 16, follows the variation of the gate voltage waveform to raise gently. As a result, as shown in (d) of FIG. 5, the waveform of the current applied to the lump 16 varies similarly to the waveform of the voltage of the source.

The control unit 64 compares the gate voltage of the N channel MOSFET 12 with a determination threshold when the N channel MOSFET 56 is in the on-state based on the PWM signal and the gate-to-source capacitance of the N channel MOSFET 12 is charged. The determination threshold is for determining that the N channel MOSFET 12 is in a full-on-state. When the control unit 64 determines that the gate voltage of the N channel MOSFET 12 reaches the determination threshold, the control unit 64 outputs an on signal for turning on the N channel MOSFET 61. When the N channel MOSFET 61 is turned on, the gate potential of the PNP transistor 57 decreases, and the PNP transistor 57 is also turned on. As a result, the collector current of the PNP transistor 57 flows into the gate of the N channel MOSFET 12 through the resistor 60, and, as shown in (b) of FIG. 5, the gate voltage of the N channel MOSFET 12 is rapidly raised. The control unit 64 suspends the on signal of the N channel MOSFET 61 after the predetermined time period passes.

As a result, the gate-to-source capacitance of the N channel MOSFET 12 can be rapidly charged when the N channel MOSFET 12 is in the full-on-state and the gate voltage of the N channel MOSFET 12 needs not to be alleviated to reduce the radio noise. Therefore, a period for charging the gate-to-source capacitance of the N channel MOSFET 12 can be reduced.

Conversely, as shown in (a) of FIG. 5, when the PWM signal is changed from the high-level to the low-level, the control unit 64 outputs the on signal for turning on the N channel MOSFET 63. When the N channel MOSFET 63 is turned on, the gate of the N channel MOSFET 12 is connected to the ground through the resistor 62 and the N channel MOSFET 63. Therefore, the gate voltage of the N channel MOSFET 12 can be rapidly decreased to a level at which the N channel MOSFET 12 is turned off. The control unit 64 monitors the gate voltage of the N channel MOSFET 12. When the control unit 64 determines that the gate voltage of the N channel MOSFET 12 is decreased to be the level, the control unit 64 suspends the on signal outputted to the N channel MOSFET 63.

When the PWM signal is changed to the low-level, the N channel MOSFET 56 is changed from the on-state to the off-state. When the N channel MOSFET 56 is in off-state, the collector potential of the NPN transistor 54 is raised. Therefore, the NPN transistors 54 and 55 providing the second current mirror circuit are turned on. In this case, the PNP transistors 51 and 52 providing the first current mirror circuit are continuously turned on regardless of the state of the N channel MOSFET 56.

As described above, the mirror ratio of the first current mirror circuit is set to 1:N, while the mirror ratio of the second current mirror circuit is set to 1:2N. Therefore, the NPN transistor 55 of the second current mirror circuit can discharge the current, which flows from the PNP transistor 52 of the first current mirror circuit trough the resistor 53, from the gate-to-source capacitance of the N channel MOSFET 12. Additionally, the NPN transistor 55 of the second current mirror circuit can discharge the current, which has an amount same as the current flowing from the PNP transistor 52, from the gate-to-source capacitance of the N channel MOSFET 12. As a result, the gate-to-source capacitance of the N channel MOSFET 12 in the charging state is discharged with the time constant same as in charging. Accordingly, the falling of the waveform of the gate voltage is alleviated, as shown in (b) of FIG. 5, and similarly, the falling of the waveform of the source voltage is also alleviated, as shown in (c) of FIG. 5. As shown in (d) of FIG. 5, the falling of the waveform of the current applied to the lamp 16 is alleviated as the waveform of the source voltage. In this case, the rising waveform of the current of the lump 16 and the falling waveform of the current of the lump 16 are symmetric, that is, the rising waveform is obtained by folding the falling waveform along the lapse of time.

Accordingly, the drive voltage generating circuit 50 applies a constant current to gate of the N channel MOSFET 12 through the resistor 53, with the first current mirror circuit and the second current mirror circuit, at an initial stage and an end stage of a period during which the PWM signal instructing the N channel MOSFET 12 to be turned on is outputted. The drive voltage generating circuit 50 can alleviate the rising and the falling of the gate voltage using the input capacitance between the gate and the source of the N channel MOSFET 12, and can reduce the radio noise caused by the operation of the N channel MOSFET 12.

As discussed above, the switching element driving circuit of the present embodiment can reduce the radio noise generated in the charge pump circuit 20 as well as the radio noise generated in the drive voltage generating circuit 50. Therefore, the noise can be sufficiently restricted by the switching element driving circuit of the present embodiment.

Although the embodiment of the present disclosure is described, the present disclosure is not limited to the embodiment described above and may be implemented in various other ways without departing from the gist of the present disclosure.

For example, in the above embodiment, an example in which the switching element driving circuit drives one lump 16 is described. However, the switching element driving circuit may drive plural lumps 16. In such a case, necessary numbers of series circuits of the lumps 16 and the N channel MOSFETs 12 are connected in parallel with each other between the battery source and the ground. Additionally, the same numbers of drive voltage generating circuits 50 are prepared and each of the drive voltage generating circuits 50 is connected to the gate of the corresponding one of the N channel MOSFETs 12. The charge pump circuit 20 may be commonly provided for the drive voltage generating circuits 50.

When one charge pump circuit 20 is commonly provided for the drive voltage generating circuits 50, it is preferable that the charge pump circuit 20 includes a unit that changes the oscillating frequency of the oscillator 25 according to the number of the drive voltage generating circuits 50 that simultaneously generates the drive voltage.

As discussed above, the oscillating frequency of the oscillator 25 prescribes the switching frequencies for switching the charging/discharging of the capacitors 30, 32, 34 and 36 of the charge pump circuit 20. When the switching frequencies increase, boosting capacity of the charge pump circuit 20 is improved, but the power consumption of the charge pump circuit 20 is increased. Conversely, when the switching frequencies decrease, boosting capacity of the charge pump circuit 20 is reduced, but the power consumption of the charge pump circuit 20 is reduced. Therefore, when the oscillating frequency of the oscillator 25 is changed according to the number of the drive voltage generating circuits 50 that simultaneously operate, that is, the number of the N channel MOSFETs 12 that need to be driven, the charge pump circuit 20 can be operated efficiently. Specifically, it is preferable to increase the switching frequency in the case where the large number of the N channel MOSFETs 12 need to be driven, compare to the case where the small number of the N channel MOSFETs 12 need to be driven.

In the above embodiment, an example of the operation of the drive voltage generating circuit 50 is described. When the drive voltage generating circuit 50 charges the gate-to-source capacitance of the N channel MOSFET 12, the drive voltage generating circuit 50 starts the rapid charging of the N channel MOSFET 12 in the full-on-state. When the drive voltage generating circuit 50 discharges the gate-to-source capacitance of the N channel MOSFET 12, the drive voltage generating circuit 50 performs the rapid discharging of the N channel MOSFET 12 to have the voltage at which the N channel MOSFET 12 is turned off. However, the drive voltage generating circuit 50 is not limited to the example. For example, the structure of the drive voltage generating circuit 50 performing the rapid charging and the rapid discharging may be omitted. The drive voltage generating circuit 50 may perform the charging/discharging of the N channel MOSFET 12 only using the first and the second current mirror circuits. Furthermore, various signal output circuits described in JP 2011-166727 A (corresponding to US 2011/0169475 A1) may be employed as the drive voltage generating circuit of the present disclosure.

While only the selected exemplary embodiment and examples have been chosen to illustrate the present disclosure, it will be apparent to those skilled in the art from this disclosure that various changes and modifications can be made therein without departing from the scope of the disclosure as defined in the appended claims. Furthermore, the foregoing description of the exemplary embodiment and examples according to the present disclosure is provided for illustration only, and not for the purpose of limiting the disclosure as defined by the appended claims and their equivalents.

What is claimed is:

1. A switching element driving circuit comprising:
    a charge pump circuit that generates a boosted voltage; and
    at least one drive voltage generating circuit that
        generates a drive voltage, for driving at least one voltage-driven switching element having an input capacitance at a control terminal, from the boosted voltage generated in the charge pump circuit,
        applies a current to the control terminal of the voltage-driven switching element through a resistor at least in an initial stage and an end stage of an output period during which a signal instructing the voltage-driven switching element to be turned on is outputted, and
        alleviates a rising and a falling of the drive voltage using the input capacitance, wherein
    the charge pump circuit includes a plurality of capacitors and a control circuit,
    each of the plurality of capacitors includes a pair of electrodes that are made of conductors, and an insulation film that is formed at a surface of a semiconductor substrate and arranged between the pair of electrodes,
    the charge pump circuit and the drive voltage generating circuit are formed in the semiconductor substrate,
    the control circuit switches a voltage, which is applied to one electrode of the pair of electrodes of each of the plurality of capacitors, between a high-potential-voltage and a low-potential-voltage at a predetermined switching frequency to alternately perform a charging and a discharging of each of the plurality of capacitors,
    the control circuit integrates charges of the plurality of capacitors in an order from a first capacitor to a last capacitor, the first capacitor being one capacitor of the plurality of capacitors, the last capacitor being another capacitor of the plurality of capacitors, and each voltage outputted from the plurality of capacitors being sequentially boosted in the order from the first capacitor to the last capacitor, and
    the switching frequency of the charge pump circuit is set from 2 MHz to 30 MHz thereby reducing noise from the driving the at least one voltage-driven switching element.

2. The switching element driving circuit according to claim 1, wherein
    the switching frequency of the charge pump circuit is set from 5 MHz to 20 MHz.

3. The switching element driving circuit according to claim 1, wherein
    the control circuit includes:
        a plurality of backflow preventing diodes each of which is disposed on a connection line connecting adjacent two of the plurality of capacitors to prevent a backflow of a current; and
        a clamp circuit that clamps the boosted voltage generated in the charge pump circuit at a target voltage, and
    the target voltage is set so that a difference of amplitudes of voltage variations between the adjacent two of the plurality of capacitors does not exceed a withstand voltage of corresponding one of the plurality of backflow preventing diodes when the control circuit alternately performs the charging and the discharging of the plurality of capacitors to integrate the charges of the plurality of capacitors in the order from the first capacitor to the last capacitor.

4. The switching element driving circuit according to claim 1, wherein
    the at least one drive voltage generating circuit includes a plurality of drive voltage generating circuits,
    the at least one voltage-driven switching element includes a plurality of voltage-driven switching elements,
    the plurality of drive voltage generating circuits are correspondingly provided for the plurality of voltage-driven switching elements,
    the charge pump circuit is commonly provided for the plurality of drive voltage generating circuits, and
    the control circuit includes a frequency variation unit that varies the switching frequency of the charge pump circuit according to a number of the voltage-driven switching elements that are simultaneously driven.

5. The switching element driving circuit according to claim 4, wherein
    when a large number of the voltage-driven switching elements are simultaneously driven, the frequency variation unit increases the switching frequency to be higher than the switching frequency when a small number of the voltage-driven switching elements are simultaneously driven.

6. The switching element driving circuit according to claim 4, wherein
    the frequency variation unit increases the switching frequency as the number of the voltage-driven switching elements simultaneously driven increases.

7. The switching element driving circuit according to claim 1, wherein
    a first electrode of the pair of electrodes is formed at a surface layer of the semiconductor substrate,
    the insulation film is arranged on the first electrode, and
    a second electrode of the pair of electrodes is arranged on the insulation film.

8. The switching element driving circuit according to claim 1, wherein
    a capacitance of each of the plurality of capacitors is from 40 pF to 60 pF.

9. The switching element driving circuit according to claim 1, wherein
    the switching frequency of the charge pump circuit is set in a range that is higher than an AM frequency band.

* * * * *